(12) United States Patent
Ting

(10) Patent No.: US 6,980,428 B2
(45) Date of Patent: Dec. 27, 2005

(54) COMPUTER DATA READING APPARATUS

(76) Inventor: Pan Heng Ting, 235 Chung-Ho Box 8-24, Taipei (TW)

( * ) Notice: Subject to any disclaimer, the term of this patent is extended or adjusted under 35 U.S.C. 154(b) by 278 days.

(21) Appl. No.: 10/437,608

(22) Filed: May 15, 2003

(65) Prior Publication Data

US 2004/0228101 A1    Nov. 18, 2004

(51) Int. Cl.[7] .............................................. G05F 1/16
(52) U.S. Cl. ..................................... 361/685; 361/725
(58) Field of Search .. 312/223.1, 223.2; 361/683–686; 439/152–160, 928, 928.1; 360/69

(56) References Cited

U.S. PATENT DOCUMENTS 5,041,924 A * 8/1991 Blackborow et al. ......... 360/69
5,737,185 A * 4/1998 Morrison et al. ........... 361/685
6,570,757 B2 * 5/2003 DiFonzo et al. ............ 361/683
6,680,843 B2 * 1/2004 Farrow et al. .............. 361/681

* cited by examiner

Primary Examiner—Lynn Feild
Assistant Examiner—Anthony Q. Edwards

(57) ABSTRACT

A computer data reading apparatus has a reading device installed to one slot of a computer so as to be connected to a joint of a reading unit for inputting data from or outputting data to a computer. The reading device includes a stand, a casing, a supporting plate, a sliding block, a cover and an outer frame. The casing is positioned across an upper side of the stand. Each of front lower sides of the casing has a hook portion. An outer side of the casing has a positioning groove for receiving a push rod. A supporting plate is locked to a rear side of the casing so as to form with a cartridge for receiving and sliding a sliding block. One side of the supporting plate is installed with an input/output port which is coupled to a joint of the reading unit.

4 Claims, 6 Drawing Sheets

COMPUTER DATA READING APPARATUS

FIELD OF THE INVENTION

The present invention relates to reading device, and particularly to a computer data reading apparatus, wherein the reading device is modulizd so that it can be installed to a slot of a computer.

BACKGROUND OF THE INVENTION

Digital products, such as computer, PDAs, MP3s, industrial computers, etc., are more and more popular in the current human life, however reading devices are important I/O devices. Currently, there are a variety of memory cards, such as compact flash cards (CF cards, smart cards (SM cards), MMC cards (multi media cards), security digital cards (SD cards), memory stick card (MS cards), magic gate cards (MG cards), etc., are used commonly by people. General, the memory cards can not match the specification of a computer interface since the computer interface is designed for only a few kinds of memory cards. Thereby, adaptors are developed to be installed between the interfaces and the memory cards. The data can be transferred between the interface of the computer and the memory card. However in this prior art the transmission speed is low and adaptor are dependent on memory cards. Thereby, the users must prepare different kinds of adaptors for matching the kinds of the memory cards. It is inconvenient and the price is high.

SUMMARY OF THE INVENTION

Accordingly, the primary object of the present invention is to provide a computer data reading apparatus having a reading device installed to one slot of a computer so as to be connected to a joint of a reading unit for inputting data from or outputting data to a computer. The reading device includes a stand, a casing, a supporting plate, a sliding block, a cover and an outer frame. The casing is positioned across an upper side of the stand. Each of front lower sides of the casing has a hook portion. An outer side of the casing has a positioning groove for receiving a push rod. A supporting plate is locked to a rear side of the casing so as to form with a cartridge for receiving and sliding a sliding block. One side of the supporting plate is installed with an input/output port which is coupled to a joint of the reading unit.

The various objects and advantages of the present invention will be more readily understood from the following detailed description when read in conjunction with the appended drawing.

DETAILED DESCRIPTION OF THE PREFERRED EMBODIMENTS

Figure 1:
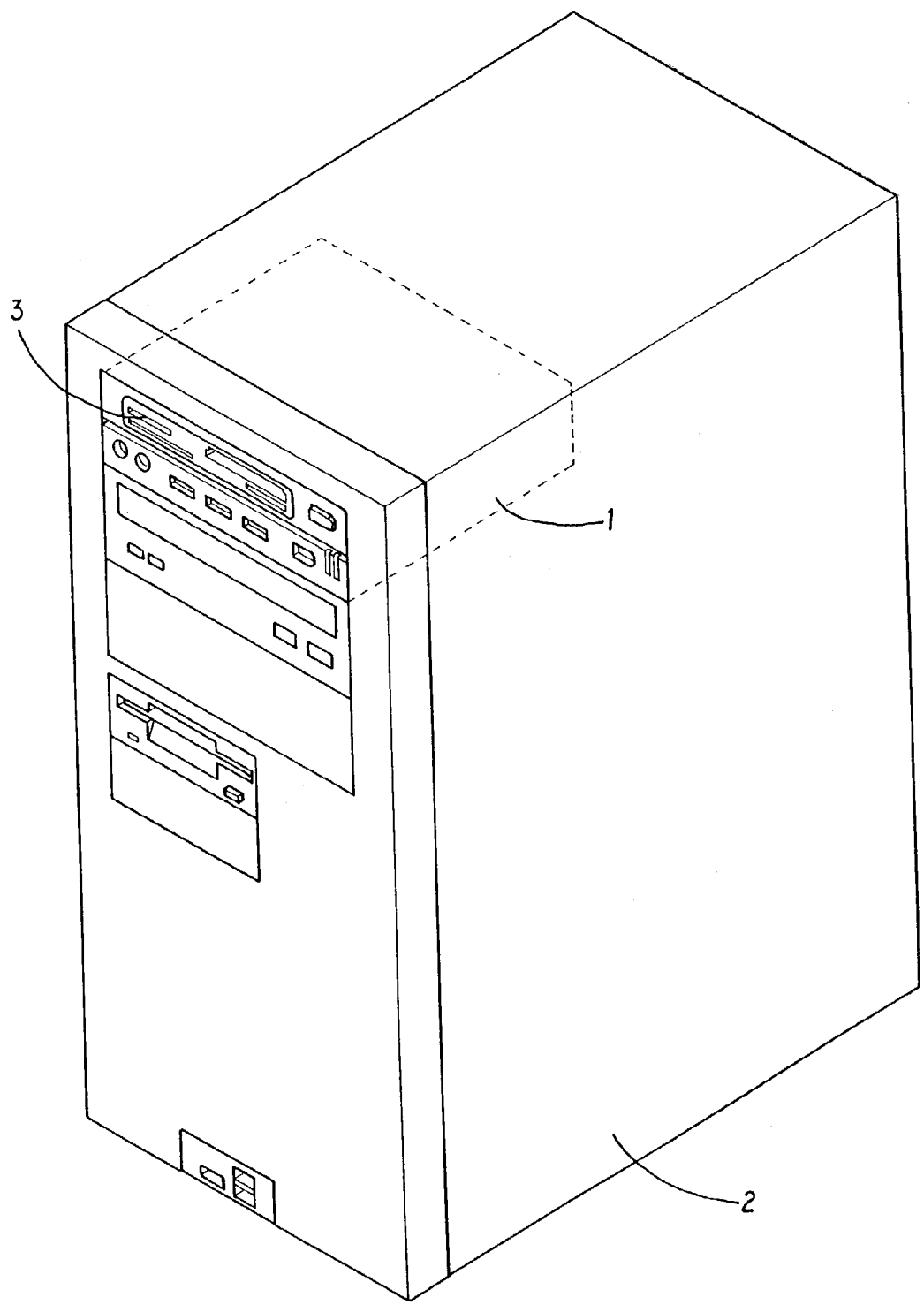
FIG. 1 shows the installation of the present invention which is installed to a slot of a computer.
Figure 2:
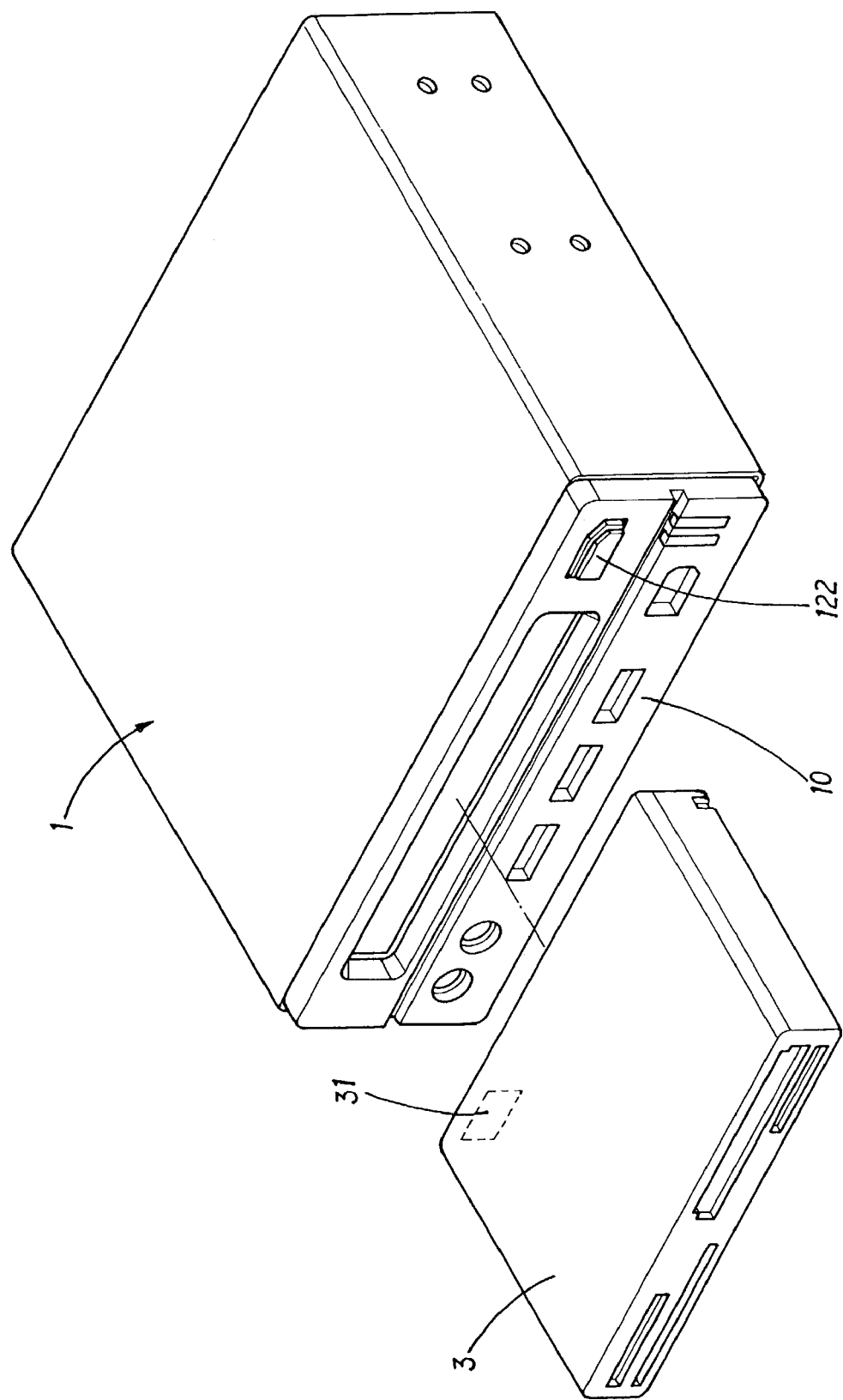
FIG. 2 is a schematic view showing the insertion of the reading device and the reading unit of the present invention.

Referring to FIGS. 1 and 2, the computer data reading apparatus of the present invention is illustrated. A reading device 1 is installed to one slot of a computer 2 so as to be connected to the joint 31 of a reading unit 3 for inputting data from or outputting data to the computer 2.

Figure 3:
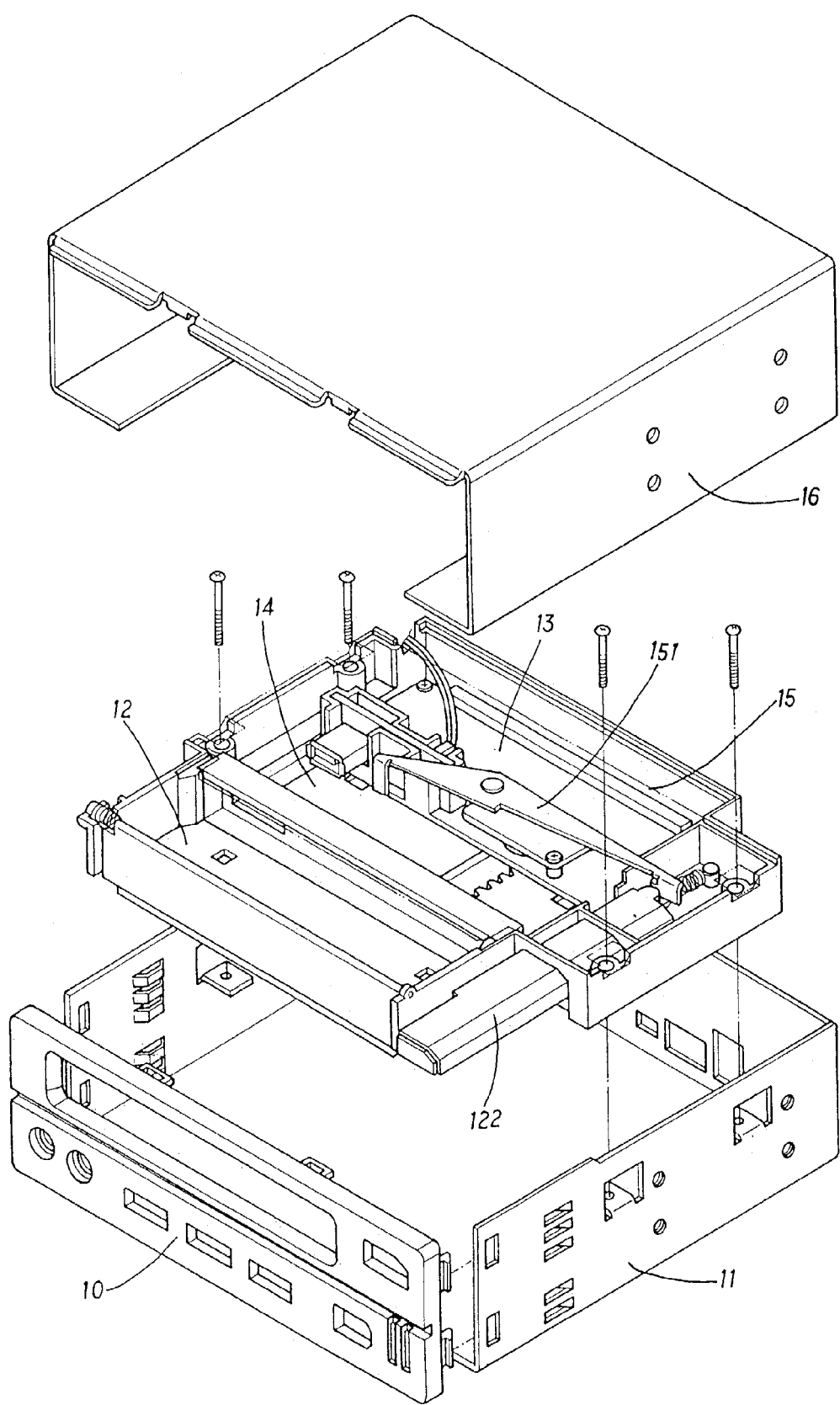
FIG. 3 shows the internal structure of the reading unit of the present invention.
Figure 4:
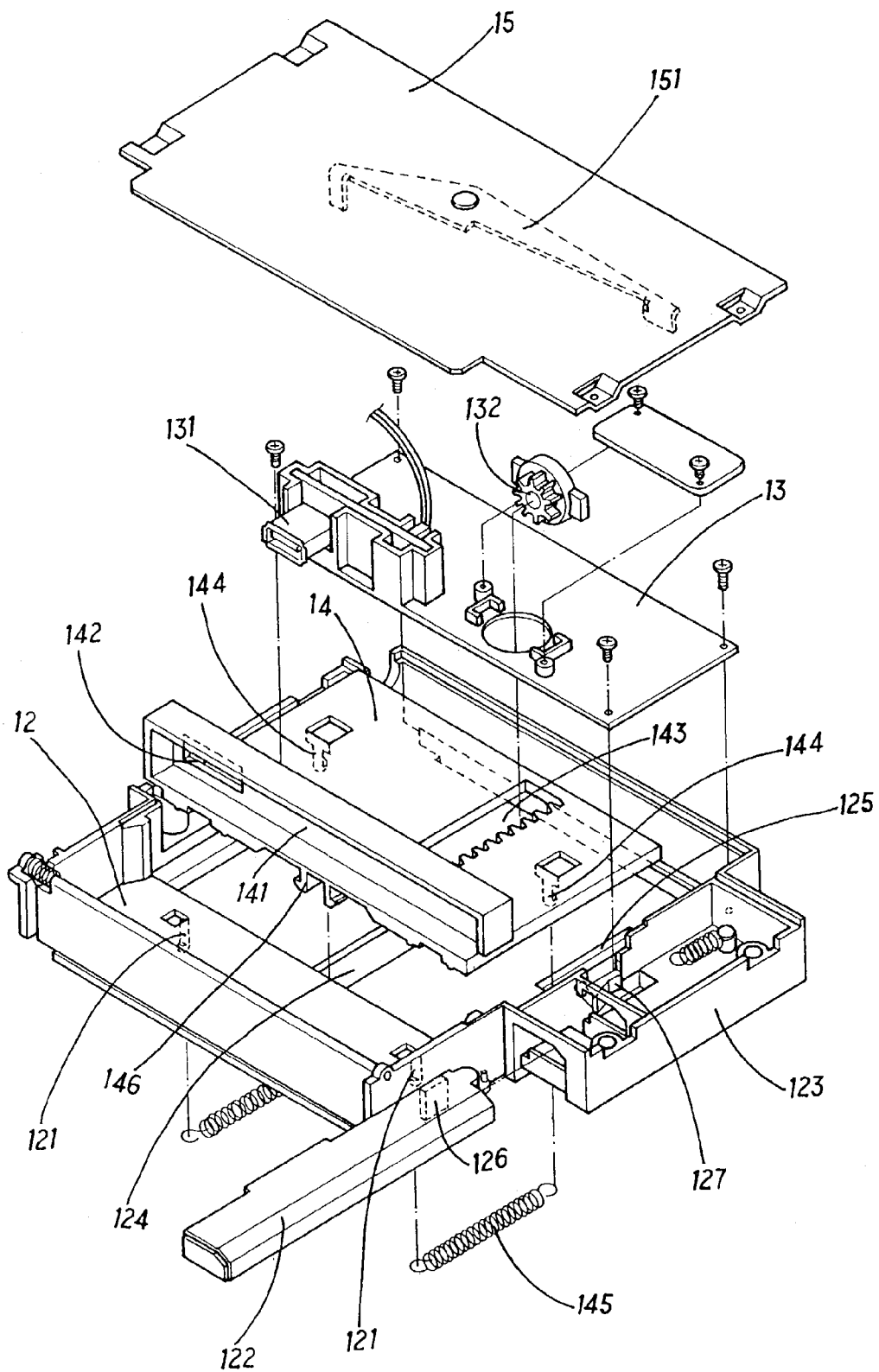
FIG. 4 is an exploded perspective view of the reading device of the present invention.
Figure 5:
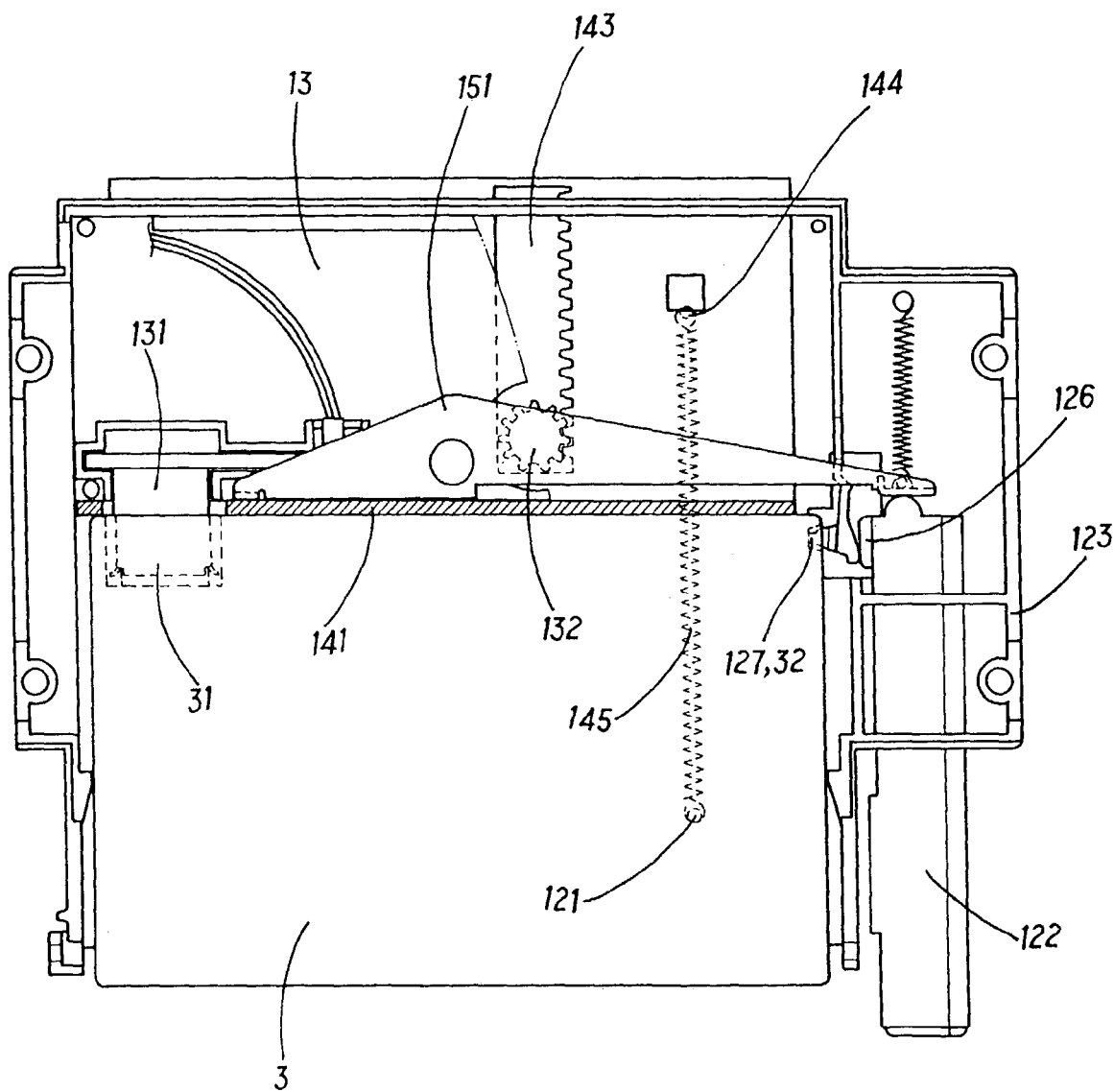
FIG. 5 is a plane showing that the reading unit of the present invention being inserted into a reading device.

With reference to FIGS. 3 to 5, the reading device includes a stand 11, a casing 12, a supporting plate 13, a sliding block 14, a cover 15 and an outer frame 16. The stand 11 is installed at one slot of a computer 2. A front end of the stand 11 has a control panel 10. The casing 12 run across an upper side of the stand 11. Each of the front lower sides of the casing 12 has a hook portion 121. An outer side of the casing 12 has a positioning groove 123 for receiving a push rod 122. The supporting plate 13 is locked to a rear side of the casing 12 so as to form with a cartridge for receiving and sliding a sliding block 14. One side of the supporting plate 13 is installed with an I/O port 131 which is coupled to the joint 31 of the reading unit 3. A bottom of the supporting plate 13 is secured with an oil pressure gear 132. The sliding block 14 is installed in the cartridge formed by the supporting plate 13 and the casing 12. A front end of the sliding block 14 has a stopper 141 and a via hole 142. A bottom of the sliding block 14 has a teethed groove 143 at position corresponding to the oil pressure gear 132 of the supporting plate 13. A lower rear side of the sliding block 14 is extended downwards with an ear 144. The elastic element 145 is suspended between the hook portion 121 of the casing 12 and the ear 144. An inner surface of the cover 15 is pivotally installed with a swingable arm 151 so that the cover 15 exactly covers the casing 12 so that one end of the swingable arm 151 is positioned to a rear side of the push rod 12, and another end thereof resists against a rear side of the stopper 141. When the push rod 122 is pushed, the swingable arm 151 will eject the stopper 141. By the pull force of the elastic element 145 and the damping of the oil pressure gear 132, the reading unit 3 can be transferred smoothly (referring to FIG. 6).

Moreover, the sliding block 14 has a preferred sliding ability. A center of the casing 12 is formed with a buckling groove 124 at a position corresponding to the protrusion 146 at the bottom surface of the sliding block 14. The protrusion 146 can be hooked to the two lateral walls of the buckling groove 124 so that the sliding block 14 is positioned to the casing 12 and moves along an axial line. Moreover, a rear bottom of the casing 12 has a sliding groove 125. The ear 144 of the sliding block 14 can pass through the sliding groove 125. Thereby, elastic element 145 can be easily hooked between the ear 144 and the hook portion 121 of the casing 12. The elastic element 145 can steadily pull the ear 144 so as to move the sliding block 14.

Figure 6:
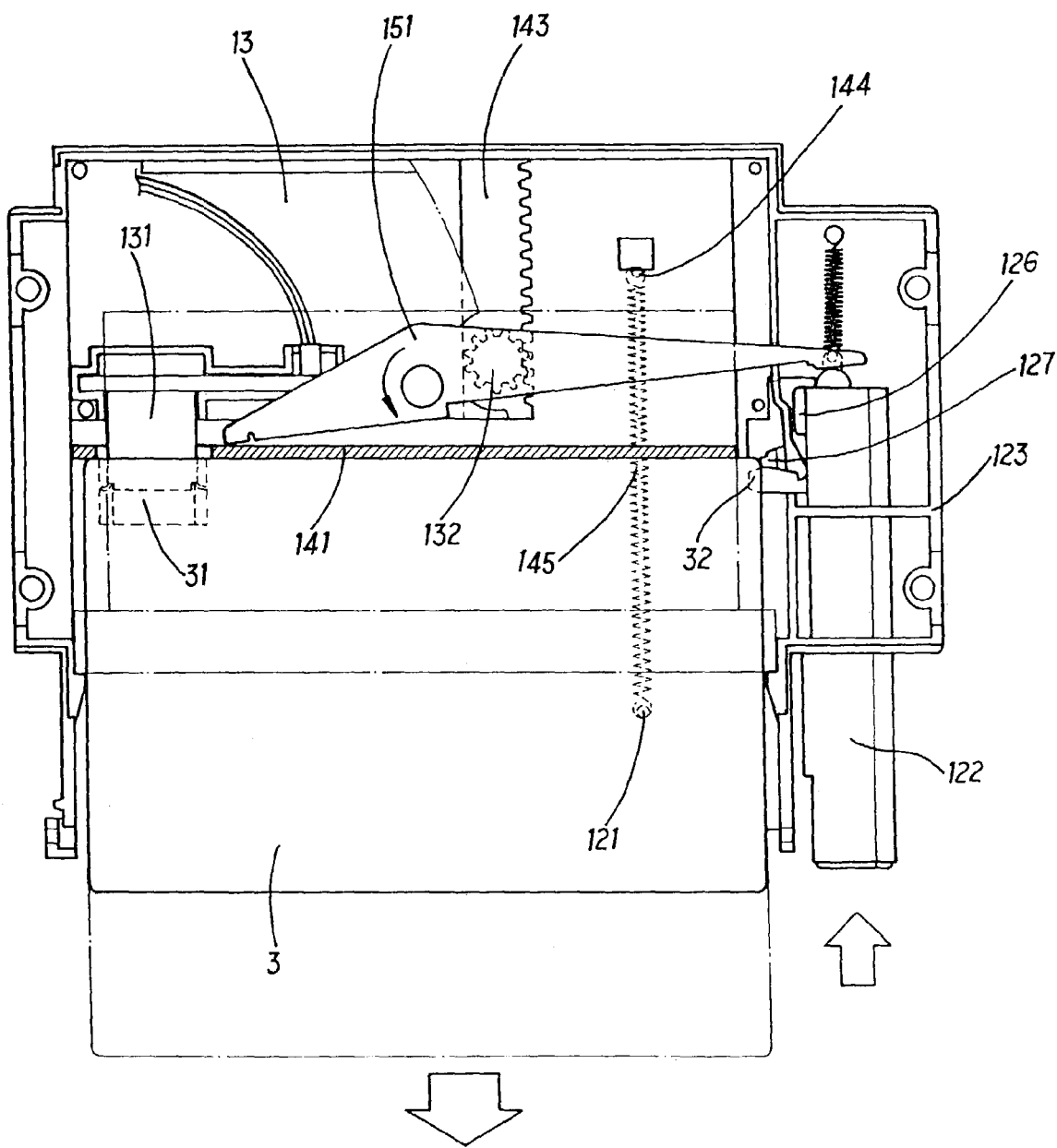
FIG. 6 is a schematic view showing that a push rod of the present invention pushes the reading unit of the present invention.

With reference to FIGS. 5 and 6, when the reading unit 3 is pushed into the reading device 1 to have a preferred buckling effect. A rear end of the inner surface of the push rod 122 has a block 126. An inner wall of the casing 12 is installed with a corresponding elastic buckle 127. When the reading unit 3 is pushed thereinto, the stopper 141 is ejected to move rearwards so that the swingable arm 151 rotates. When one end of the swingable arm 151 pushes the push rod 122 outwards, the block 126 will enforce the elastic buckle 127 to be embedded into a concave portion 32 at a lateral surface of the reading unit 3 to buckle and position the reading unit 3. Moreover, the joint 31 is firmly secured to the port 131. On the contrary, when the push rod 122 pushes inwards, the block 126 will separate from the buckling of the concave portion 32 so that another end of the swingable arm 151 can push the stopper 141 to send out the reading unit 3.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A computer data reading apparatus comprising an outer frame and having a reading device installed to one slot of a computer so as to be connected to a joint of a reading unit for inputting data from or outputting data to a computer, the reading device comprising:
   a stand installed at one slot of a computer, a front end of the stand having a control panel;
   a casing positioned across an upper side of the stand, each of front lower sides of the casing having a hook portion, an outer side of the casing having a positioning groove for receiving a push rod;
   a supporting plate being locked to a rear side of the casing so as to form with a cartridge for receiving and sliding a sliding block, one side of the supporting plate being installed with an input/output port which is coupled to a joint of the reading unit, a bottom of the supporting plate being secured with an oil pressure gear;
   a sliding block being installed in the cartridge formed by the supporting plate and the casing, a front end of the sliding block having a stopper and a via hole, a bottom of the sliding block having a teethed groove at position corresponding to the oil pressure gear of the supporting plate, a lower rear side of the sliding block being extended downwards with an car, an elastic element being suspended between the hook portion of the casing and the ear;
   a cover, an inner surface of the cover being pivotally installed with a swingable arm so that the cover exactly covers the casing and thus one end of the swingable arm being positioned to a rear side of the push rod, and another thereof rests against a rear side of the stopper, when the push rod is pushed, the swingable arm ejects the stopper, a pulling force of the elastic element and damping of the oil pressure gear allow the reading unit to be transferred smoothly.

2. The computer data reading apparatus of claim 1, wherein a center of the casing is formed with a buckling groove at a position corresponding to a protrusion at a bottom surface of the sliding block, the protrusion being hooked to two lateral walls of the buckling groove so that the sliding block is positioned to the casing and moves along an axial line thereof.

3. The computer data reading apparatus of claim 1, wherein a rear bottom of the casing has a sliding groove, the ear of the sliding block passes through the sliding groove, thus the elastic element is hooked between the ear and the hook portion of the casing, such that the elastic element steadily pulls the ear so as to move the sliding block.

4. The computer data reading apparatus of claim 1, wherein a rear end of the inner surface of the push rod has a block, an inner wall of the casing is installed with a corresponding elastic buckle, when the reading unit is pushed thereinto, the stopper is ejected to move rearwards so that the swingable arm rotates, when one end of the swingable arm pushes the push rod outwards, the block will enforce the elastic buckle to be embedded into a concave portion at a lateral surface of the reading unit so as to buckle and position the reading unit, the joint being firmly secured to the port, such that when the push rod pushes inwards, the block will separate from the buckling of the concave portion so that another end of the swingable arm pushes the stopper so as to transfer the reading unit out.

* * * * *